United States Patent
Kittl et al.

(10) Patent No.: US 6,777,300 B2
(45) Date of Patent: Aug. 17, 2004

(54) METHOD TO IMPROVE SILICIDE FORMATION ON POLYSILICON

(75) Inventors: Jorge Adrian Kittl, Plano, TX (US); Qi-Zhong Hong, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/023,825

(22) Filed: Dec. 19, 2001

(65) Prior Publication Data

US 2002/0086485 A1 Jul. 4, 2002

Related U.S. Application Data

(60) Provisional application No. 60/259,401, filed on Dec. 30, 2000.

(51) Int. Cl.[7] .................................. H01L 21/336
(52) U.S. Cl. .................................. 438/305; 438/303
(58) Field of Search .................. 438/197, 299, 438/301, 303, 305, 306

(56) References Cited

U.S. PATENT DOCUMENTS

| | | | | |
|---|---|---|---|---|
| 4,855,247 A | * | 8/1989 | Ma et al. | 438/305 |
| 4,906,589 A | * | 3/1990 | Chao | 438/305 |
| 4,963,504 A | * | 10/1990 | Huang | 438/305 |
| 5,045,486 A | * | 9/1991 | Chittipeddi et al. | 438/231 |
| 5,089,432 A | * | 2/1992 | Yoo | 438/231 |
| 5,102,815 A | * | 4/1992 | Sanchez | 438/305 |
| 5,330,925 A | * | 7/1994 | Lee et al. | 438/303 |
| 5,583,067 A | * | 12/1996 | Sanchez | 438/289 |

* cited by examiner

*Primary Examiner*—Evan Pert
*Assistant Examiner*—Russell M. Kobert
(74) *Attorney, Agent, or Firm*—Jacqueline J. Garner; W. James Brady, III; Frederick J. Telecky, Jr.

(57) ABSTRACT

A polysilicon layer of a gate structure is covered by an implant blocking layer (e.g., silicon nitride). The implant blocking layer blocks introduction of implanted dopants while implanting an initial dose of first conductivity type dopant (e.g., for drain extension regions). The implant blocking layer is then removed and an additional dose of first conductivity type dopant in implanted to form the main source/drain regions. Then, metal is deposited and reacted to form a conductive silicide.

4 Claims, 3 Drawing Sheets

METHOD TO IMPROVE SILICIDE FORMATION ON POLYSILICON

This application claims the benefit of Provisional Application Serial No. 60/259,401 filed Dec. 30, 2000.

BACKGROUND AND SUMMARY OF THE INVENTION

The present invention relates to integrated circuit structures and fabrication methods, and specifically relates to formation of a gate structure.

One of the most convenient materials for integrated circuit fabrication is doped polysilicon. This is a well-understood conductive material which is (of course) chemically compatible with silicon, has very similar work function values, and tends to have good interfaces with the materials used in silicon processes. However, the resistivity of polysilicon is much less than that of most metals. This is unfortunate since, even as the size of integrated circuits shrinks, the demand for higher performance, including decreased resistance on conductive lines, increases.

It has therefore been common for many years to "clad" polysilicon lines with a metallic conductor, in order to combine the favorable interface and work function properties of polysilicon with the lowered sheet resistance which can thus be achieved. In logic integrated circuits, polysilicon gate lines commonly use a self-aligned metal silicide, such as titanium or cobalt silicide, to reduce gate resistance and gate propagation delay. (This is typically done by depositing metal overall, annealing to cause silicide formation where silicon is exposed, and then selectively removing the unreacted metal.) Further background in silicided gate structures can be found in *Silicon Processing for the VLSI Era*, Wolf et al., 1986 (see especially Volume 1, Chapter 11 on "Refractory Metals and Their Silicides in VLSI Fabrication" and Volume 2, Chapter 3 on "Contact Technology and Local Interconnects for VLSI"), which is hereby incorporated by reference.

A new problem has arisen in recent generations of technology. With the scaling of transistor dimensions, the depth of the source/drain extension diffusions (LDD or MDD) has been reduced, and the peak doping concentration of these regions (in atoms per cubic centimeter) has increased. The present inventors have realized that this creates a problem with siliciding: very heavily doped polysilicon is slower to form a silicide. The shallow high-dose implant used to form the source/drain extensions thus degrades later silicide formation, since the upper surface of the polysilicon has an extremely high dopant concentration before annealing.
Method to Improve Silicide Formation on Polysilicon The present application discloses an innovative way to produce a silicide on a polysilicon layer. The implant (or implants) which forms the source/drain extensions gate is masked from the gate, but allowed to hit the active area. (Optionally the main source/drain implants can also be masked from the gate.) Preferably this is done by a masking layer (e.g. silicon nitride) which is selectively removed before the metal for the salicide reaction is deposited.

Advantages of the disclosed methods and structures, in various embodiments, can include one or more of the following:

implanted ions do not reach the polysilicon surface, allowing more uniform silicide formation;

capability to selectively block the implantation into the source/drain and/or the source/drain extensions.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 1:
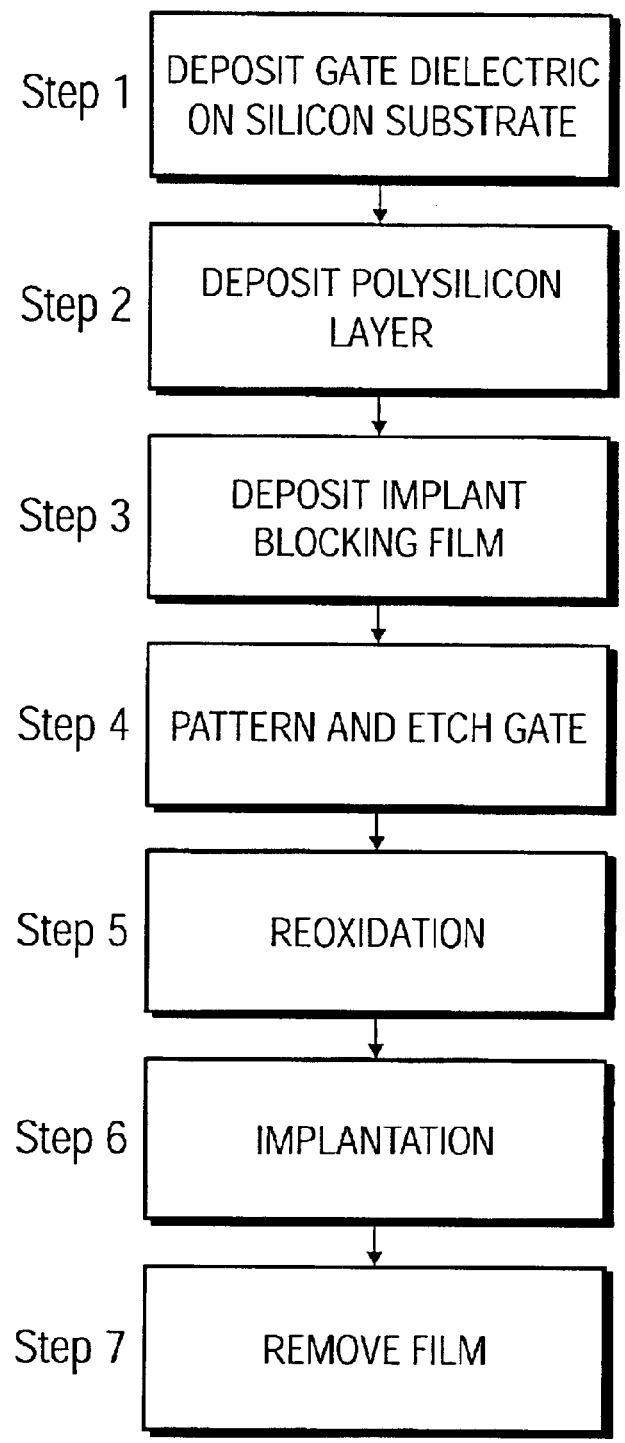
FIG. 1 is a flow chart showing key steps to the preferred embodiment.
Figure 2:
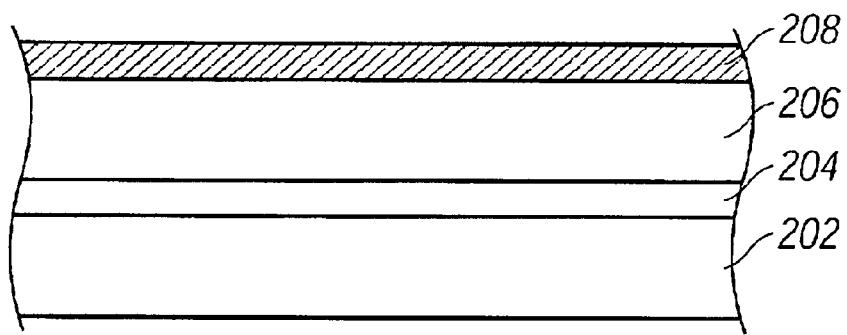
FIG. 2 is a cross sectional diagram of a partially fabricated wafer according to the preferred embodiment.

The preferred embodiment is discussed with reference to the figures. FIG. 1 is a flow chart showing key steps of the innovative process. First a gate dielectric is grown on a silicon (or other semiconductor material) substrate (step 1). A polysilicon layer is then deposited (step 2), followed by deposition or growth of the film that will block the implanted dopants (step 3). The exact method of formation of this layer will depend on the type of material chosen. In the preferred embodiment, silicon nitride is used. This leaves a three layer structure on the substrate as shown in FIG. 2.

Figure 3:
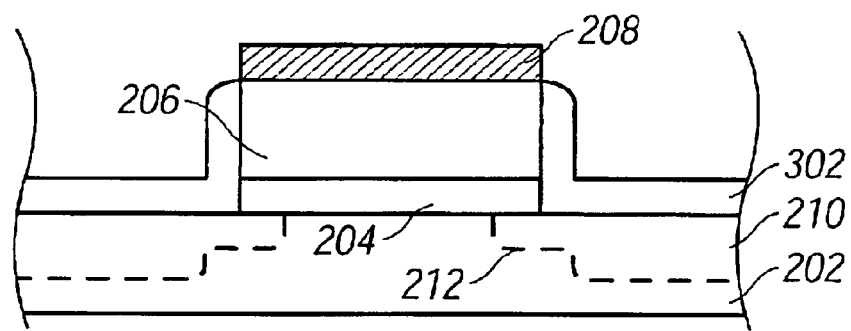
FIG. 3 is a cross sectional diagram of a partially fabricated wafer according to the preferred embodiment.

The gate stack is then patterned using known methods (such as photolithography) and etched (step 4). Re-oxidation follows (step 5), leaving a polysilicon gate structure topped by the silicon nitride film, and walled on either side by the new oxide layer (which also covers the silicon substrate) as shown in FIG. 3.

Figure 4:
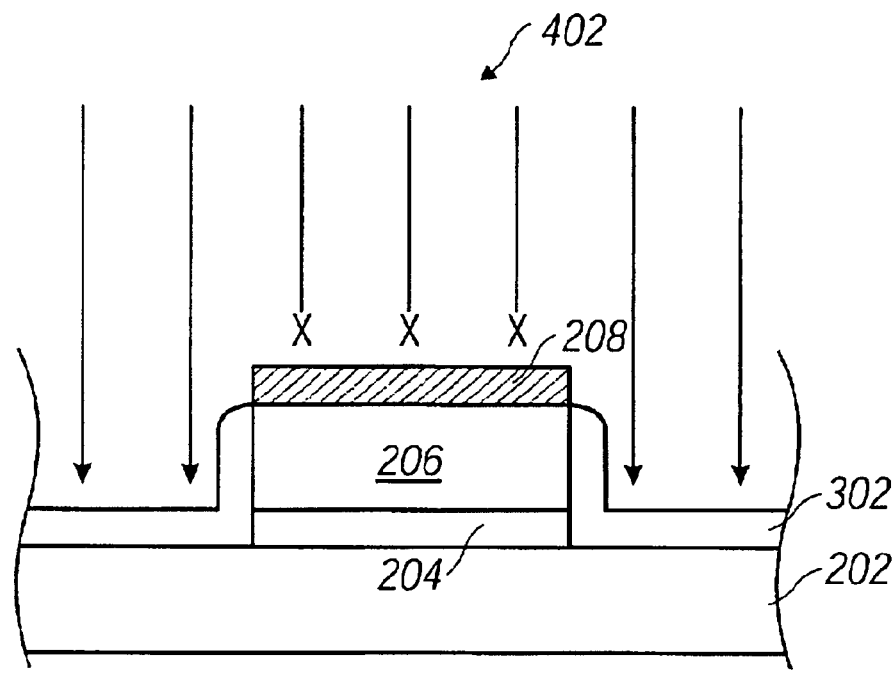
FIG. 4 shows a cross sectional diagram of a partially fabricated wafer according to the preferred embodiment.

Implantation for the source and drain extensions (and optionally for the source and drain) follows (step 6), as shown in FIG. 4. Implantation is done by using an ion implanter as known to those skilled in the relevant art. This leaves a gate structure with the implanted dopant ions occupying the source and drain regions but not the gate region, which was protected by the silicon nitride film implanted in step 3.

After implantation, at a step preceding metal deposition for the salicide process, the film is removed (step 7). The process for completing the gate structure and contacts for the transistor follow as required by the particular process being used.

During standard CMOS processing, the implanted dopants are used to form shallow or ultra-shallow junctions (i.e., the source and drain, and/or the source and drain extensions). The dopants are implanted, activated, and/or diffused during an anneal step in the process. For shallow junctures, low energy implants can be used and are usually followed by rapid thermal processing (RTP) instead of a furnace anneal to prevent excessive diffusion. This results in a relatively high dopant concentration near the silicon surface. Since the dopants are also implanted into the silicon gates, a relatively high dopant concentration is obtained near the gate surface as well. This dopant concentration at the gate surface interferes with proper silicide formation, resulting in thinner or non-uniform films, particularly on narrow gates. This increases the sheet resistance at the end of the salicide process. By masking the gate before dopant implantation, the dopants do not reach the polysilicon layer of the gate structure, resulting in better silicide formation.

In general, heavier doping improves the bulk resistivity of polysilicon. However, the present application teaches that, in the context of salicided gates, the ultimate sheet resistance can be improved by blocking some implantation from the gate. This teaching may seem paradoxical, but is derived from the mechanics of salicide formation as explained herein.

Though the preferred embodiment has been described in a process that deposits the implant blocking film at a step before polysilicon gate patterning, the present innovations can be implemented into different process flows. For example, the implant blocking film can optionally be formed after the gate poly has been patterned, but before implantation of dopant ions into the source and drain regions.

Figure 5:
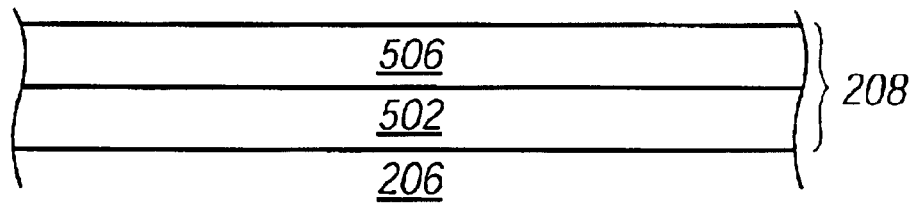
FIG. 5 shows an alternative implant blocking film structure.

In the preferred embodiment, the film blocking the dopant implantation is of a material that can be removed with selectivity to silicon, such as silicon nitride or SiO2. The film can be of a bi-layer structure. For example, FIG. 5 shows a possible bi-layer implant blocking film 208 comprising a lower layer 502 (which would abut the polysilicon layer 206) made from SiO2, and a top layer 506 of silicon nitride.

Depending on the exact process flow used, the implant blocking film can block implantation of the source and drain extensions as well as the gate, allowing the deeper source and drain implants to be incorporated into the source and drain. Blocking only the extension implants is effective in improving silicide formation because the shallower source/drain extension implants incorporate dopants specifically into a very thin layer on the silicon.

In other implementations, both the source/drain and the source/drain extension implants are blocked. The problem that arises with silicidation is that a high dopant concentration at the silicon surface interferes with silicide formation on silicon. The source/drain extension implants, which are shallower than the normal source/drain implants, leave greater concentrations of ions at the surface than the deeper source/drain implants. Therefore it is advantageous in some process contexts to block neither the source/drain extension nor the source/drain, or blocking just the source/drain extension and not the source and drain implants, depending on the depths and concentrations of the implants in the particular process used.

FIG. 2 shows a three level structure on top of a silicon substrate 202. The gate dielectric 204 is topped by a layer of polysilicon 206, which is covered by the film 208 to block implanted dopants. The source/drain 210 may or may not also be covered by the implant blocking film, as might the source/drain extensions 212, depending on the process context, as mentioned above.

FIG. 3 shows the three layer structure after it has been patterned and etched, and after reoxidation has been performed, leaving a thin layer of SiO2 302 on the sides of the polysilicon layer 206. The implant blocking film 208 may block only the gate area, or can also block the source/drain extensions and/or the source drain implants.

FIG. 4 shows the three layer structure and the blocking of implanted dopant materials 402. Since the dopants 402 do not reach the poly layer 206, the poly surface is relatively free from dopant materials and is capable of higher quality silicide formation.

According to a disclosed class of innovative embodiments, there is provided: A method of forming an integrated circuit transistor structure, comprising the steps of: a) forming a patterned polysilicon layer, and a masking layer thereover, over a gate dielectric over a silicon body; b) implanting an initial dose of first-conductivity-type dopants to form source/drain extension diffusions in said body; c) implanting an additional dose of first-conductivity-type dopants, with a deeper stopping distance than said implanting step b), to form main source/drain diffusions in said body; d) depositing metal overall, and reacting said metal to form a conductive silicide compound in at least some locations; and e) removing said masking layer after said step b), and before said step c); wherein said step c), but not said step b), is performed with sidewall spacers present on said patterned polysilicon layer; and wherein said source/drain diffusions, said source/drain extension diffusions, and a portion of said body under said polycrystalline layer form a transistor; whereby said step e) reduces the surface dopant concentration of said polysilicon before said step d), and thereby improves the sheet resistance value and/or uniformity after said step d).

According to another disclosed class of innovative embodiments, there is provided: A method of forming an integrated circuit transistor structure, comprising the steps of: a) forming a patterned polycrystalline semiconductor layer, and a masking layer thereover, over a semiconductor body; b) implanting an initial dose of first-conductivity-type dopants to form source/drain extension diffusions in said body; c) implanting an additional dose of first-conductivity-type dopants to form main source/drain diffusions in said body; d) depositing metal overall, and reacting said metal to form a conductive metal-semiconductor compound in locations where said metal is deposited on said semiconductor; and e) removing said masking layer after said step b), and before said step c); wherein said source/drain diffusions, said source/drain extension diffusions, and a portion of said body under said polycrystalline layer form a transistor; whereby said step e) improves the sheet resistance value and/or uniformity after said step d).

According to another disclosed class of innovative embodiments, there is provided: A method of forming an integrated circuit transistor structure, comprising the steps of: a) forming a patterned polysilicon layer, and a masking layer thereover, over a gate dielectric over a silicon body; b) implanting an initial dose of first-conductivity-type dopants to form source/drain extension diffusions in said body; c) implanting an additional dose of first-conductivity-type dopants to form main source/drain diffusions in said body; d) depositing metal overall, and reacting said metal to form a conductive silicide compound in at least some locations; and e) removing said masking layer after said step b), and before said step d); wherein said source/drain diffusions, said source/drain extension diffusions, and a portion of said body under said polycrystalline layer form a transistor; whereby said step e) reduces the surface dopant concentration of said polysilicon before said step d), and thereby improves the sheet resistance value and/or uniformity after said step d).

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims While the inventions have been described with primary reference to a single-poly process, it will be readily recognized that these inventions can also be applied to process with two, three, or more layers of polysilicon or polycide.

Similarly, it will be readily recognized that the described process steps can also be embedded into hybrid process flows, such as BiCMOS or smart-power processes.

The teachings above are not necessarily strictly limited to silicon. In alternative embodiments, it is contemplated that these teachings can also be applied to structures and methods using other semiconductors, such as silicon/germanium and related alloys, gallium arsenide and related compounds and alloys, indium phosphide and related compounds, and other semiconductors, including layered heterogeneous structures.

In a further contemplated class of embodiments, the disclosed gate stack masking can be used with more complicated drain implant sequences. For example, it is particularly advantageous to block the lowest-energy implants from the gate structure, even if higher-energy implants are not blocked. This can be achieved by proper sequencing of these implants, in relation to the time when the gate masking material is removed.

In combination with the innovations described above, the thickness of the gate masking material can be varied, as long as it is made thick enough to stop a significant fraction of the source/drain extension implant. For example, if the stopping distance of the source/drain extension implant is less than the depth of the gate masking material, then more than half of that implant dose will be stopped in the gate masking layer, and will be removed when the gate masking layer is removed.

In a further class of embodiments, the semiconductor material does not have to pure silicon. For example, silicon/germanium alloys are contemplated for use as monocrystalline body material (or polycrystalline gate material or both); such compounds can form conductive silicide/germanide combinations, analogously to saliciding processes.

Additional general background, which help to show the knowledge of those skilled in the art regarding variations and implementations of the disclosed inventions, may be found in the following documents, all of which are hereby incorporated by reference: Coburn, PLASMA ETCHING AND REACTIVE ION ETCHING (1982); HANDBOOK OF PLASMA PROCESSING TECHNOLOGY (ed. Rossnagel); PLASMA ETCHING (ed. Manos and Flamm 1989); PLASMA PROCESSING (ed. Dieleman et al. 1982); Schmitz, CVD OF TUNGSTEN AND TUNGSTEN SILICIDES FOR VLSI/ULSI APPLICATIONS (1992); METALLIZATION AND METAL-SEMICONDUCTOR INTERFACES (ed. Batra 1989); VLSI METALLIZATION: PHYSICS AND TECHNOLOGIES (ed. Shenai 1991); Murarka, METALLIZATION THEORY AND PRACTICE FOR VLSI AND ULSI (1993); HANDBOOK OF MULTI-LEVEL METALLIZATION FOR INTEGRATED CIRCUITS (ed. Wilson et al. 1993); Rao, MULTILEVEL INTERCONNECT TECHNOLOGY (1993); CHEMICAL VAPOR DEPOSITION (ed. M. L. Hitchman 1993); and the semiannual conference proceedings of the Electrochemical Society on plasma processing.

What is claimed is:

1. A method of forming an integrated circuit, comprising the steps of:

forming a polysilicon layer over a gate dielectric over a semiconductor substrate;

forming a blocking layer over said polysilicon layer;

patterning and etching said polysilicon layer and said blocking layer;

then, implanting an initial dose of first conductivity type dopant to form source/drain extension regions in said semiconductor substrate;

then, removing said blocking layer;

forming sidewall spacers adjacent said polysilicon layer after said step of implanting the initial dose;

then, with said sidewall spacers present, implanting an additional dose of first conductivity type dopant, with a deeper stopping distance than said implanting an initial dose step, to form main source/drain regions in said semiconductor substrate;

then, depositing a metal layer and reacting said metal layer with portions of said polysilicon layer to form a conductive silicide.

2. The method of claim 1, wherein said blocking layer comprises silicon nitride.

3. The method of claim 1, wherein said sidewall spacers consist predominantly of silicon dioxide.

4. The method of claim 1, wherein said polysilicon layer is separated from said semiconductor substrate by a gate oxide layer.

* * * * *